(12) United States Patent
Misu

(10) Patent No.: US 12,005,922 B2
(45) Date of Patent: Jun. 11, 2024

(54) TOWARD SIMULATION OF DRIVER BEHAVIOR IN DRIVING AUTOMATION

(71) Applicant: Honda Motor Co., Ltd., Tokyo (JP)

(72) Inventor: Teruhisa Misu, San Jose, CA (US)

(73) Assignee: Honda Motor Co., Ltd., Tokyo (JP)

( * ) Notice: Subject to any disclaimer, the term of this patent is extended or adjusted under 35 U.S.C. 154(b) by 191 days.

(21) Appl. No.: 17/139,788

(22) Filed: Dec. 31, 2020

(65) Prior Publication Data
US 2022/0204020 A1 Jun. 30, 2022

(51) Int. Cl.
*B60W 60/00* (2020.01)
*B60W 50/06* (2006.01)
*G06F 30/27* (2020.01)

(52) U.S. Cl.
CPC .......... *B60W 60/001* (2020.02); *B60W 50/06* (2013.01); *G06F 30/27* (2020.01)

(58) Field of Classification Search
CPC ...... B60W 60/001; B60W 50/06; G06F 30/27
See application file for complete search history.

(56) References Cited

U.S. PATENT DOCUMENTS

| | | | |
|---|---|---|---|
| 7,096,004 B2 | 8/2006 | Minear et al. | |
| 8,837,718 B2 | 9/2014 | Lauter et al. | |
| 10,021,103 B2 | 7/2018 | Xu et al. | |
| 11,436,484 B2* | 9/2022 | Farabet | G06N 3/0454 |
| 2010/0033333 A1 | 2/2010 | Victor et al. | |
| 2014/0359305 A1 | 12/2014 | Pappachan et al. | |
| 2015/0195086 A1 | 7/2015 | Davison | |
| 2015/0222606 A1 | 8/2015 | Yan | |
| 2016/0359916 A1 | 12/2016 | Kim et al. | |
| 2017/0124407 A1* | 5/2017 | Micks | B60W 40/08 |
| 2018/0009442 A1* | 1/2018 | Spasojevic | B60K 28/02 |
| 2018/0024562 A1 | 1/2018 | Bellaiche | |
| 2018/0053103 A1 | 2/2018 | Delgado et al. | |
| 2019/0023208 A1* | 1/2019 | Boston | G06V 20/597 |
| 2019/0225232 A1* | 7/2019 | Blau | G05D 1/0088 |
| 2019/0236464 A1 | 8/2019 | Feinson et al. | |
| 2019/0283746 A1 | 9/2019 | Shalev-Shwartz et al. | |
| 2019/0384303 A1* | 12/2019 | Muller | G01S 7/417 |
| 2020/0057487 A1 | 2/2020 | Sicconi et al. | |
| 2020/0082117 A1 | 3/2020 | Simmons et al. | |
| 2020/0086863 A1 | 3/2020 | Rosman et al. | |
| 2020/0139965 A1 | 5/2020 | Hanna | |

(Continued)

FOREIGN PATENT DOCUMENTS

EP 3722908 A1 * 10/2020

OTHER PUBLICATIONS

Uricar et al, "Yes, we GAN: Applying Adversarial Techniques for Autonomous Driving"; Feb. 2020 (Year: 2020).*

(Continued)

*Primary Examiner* — Hussein Elchanti
*Assistant Examiner* — Kenneth M Dunne
(74) *Attorney, Agent, or Firm* — Kubota & Basol LLP

(57) ABSTRACT

In some examples, one or more characteristics of one or more driving scenes may be obtained. Based at least on the one or more characteristics, one or more behaviors of a simulated driver may be simulated via a machine learning model. An operation associated with one or more advanced driving assistance system (ADAS) functions may be performed based at least on the simulated one or more behaviors.

24 Claims, 5 Drawing Sheets

(56) References Cited

U.S. PATENT DOCUMENTS

| | | | |
|---|---|---|---|
| 2020/0207358 A1* | 7/2020 | Katz | G01C 21/3697 |
| 2020/0210765 A1* | 7/2020 | Chinni | G06V 10/764 |
| 2020/0234145 A1 | 7/2020 | Dai et al. | |
| 2020/0344237 A1 | 10/2020 | Murdoch et al. | |
| 2020/0374269 A1 | 11/2020 | Lidman | |
| 2020/0384998 A1* | 12/2020 | Yang | B60W 10/04 |
| 2021/0009163 A1 | 1/2021 | Urtasun et al. | |
| 2021/0125067 A1 | 4/2021 | Kamatani et al. | |
| 2021/0150417 A1 | 5/2021 | Fadel Argerich et al. | |
| 2021/0163021 A1 | 6/2021 | Frazzoli et al. | |
| 2021/0166148 A1 | 6/2021 | Matsuura et al. | |
| 2021/0192358 A1 | 6/2021 | Song et al. | |
| 2021/0232913 A1 | 7/2021 | Martin et al. | |
| 2021/0248399 A1 | 8/2021 | Martin et al. | |
| 2021/0271866 A1 | 9/2021 | Hayakawa et al. | |
| 2021/0320947 A1 | 10/2021 | Moridi | |
| 2022/0122001 A1* | 4/2022 | Choe | G06N 3/084 |
| 2022/0327840 A1* | 10/2022 | Ambeck-Madsen | B60W 40/08 |

OTHER PUBLICATIONS

Dario Salvucci, "Modeling Driver Behavior in a Congitive Architecture", 2006, Human Factors, vol. 48 (Year: 2006).*

Platho et al, "Learning Driving Situations and Behavior Models from Data", 2013, IEEE Conference (Year: 2013).*

Li et al, "Improved Generative adversarial networks with reconstruction loss", Oct. 2018, Neurocomputing 323 (Year: 2018).*

Kuefler et al, "Imitating Driver Behavior with Generative Adversarial Networks", 2017, IEEE (Year: 2017).*

Oliver et al, "Graphical Models for Driver Behavior Recognition in a SmartCar", 2000, IEEE (Year: 2000).*

Martinez et al, "Driving Style Recognition for Intelligent Vehicle Control and Advanced Driver Assistance", 2018, IEEE Transactions on Intelligent Transportation Systems, vol. 19 No. 3. (Year: 2018).*

Zhang et al, "Deeproad: GAN-Based Metamorphic Testing and Input Validation Framework for Autonomous Driving Systems", Sep. 2018, Association for Computing Machinery (Year: 2018).*

Anonymous, "Toward Simulation of Driver Behavior in Level 2 Driving Automation", Conference 17, USA, Jul. 2017, 5 pages.

Antoniou et al., "Data Augmentation Generative Adversarial Networks", Available Online at: <https://arxiv.org/abs/1711.04340>, 2017, 14 pages.

Arakawa, Toshiya, "Trial Verification of Human Reliance on Autonomous Vehicles from the Viewpoint of Human Factors", International Journal of Innovative Computing, Information & Control, vol. 14, No. 2, 2017, pp. 491-501.

Barifah, Maram, "Automatic Simulation of Users for Interactive Information Retrieval", In Proceedings of the 2017 Conference on Conference Human Information interaction and Retrieval, Association for Computing Machinery, Available Online at: <https://dl.acm.org/doi/pdf/10.1145/3020165.3022168>, 2017, pp. 399-401.

Du et al., "Predicting Takeover Performance in Conditionally Automated Driving", Proc. Conference on Human Factors in Computing Systems (CHI), Available Online at: <https://dl.acm.org/doi/pdf/10.1145/3334480.3382963>, 2020, 8 pages.

Endsley, Micar., "Toward a Theory of Situation Awareness in Dynamic Systems", Hum Factors, vol. 37, No. 1, Available Online at: <https://doi.org/10.1518/001872095779049543>, Mar. 1995, pp. 32-64.

Frid-Adar et al., "GAN-based Synthetic Medical Image Augmentation for Increased CNN Performance in Liver Lesion Classification", Available Online at: <https://doi.org/10.1016/j.neucom.2018.09.013>, 2018, 10 pages.

Gold et al., "Modeling take-over performance in level 3 conditionally automated vehicles", Accident Analysis and Prevention, Available Online at: <http:/dx.doi.org/10.1016/j.aap.2017.11.009>, 2017, 11 pages.

Goodfellow et al., "Generative Adversarial Nets", Curran Associates Inc., Available Online at: <http://papers.nips.cc/paper/5423-generative-adversarial-nets.pdf>, 2014, pp. 2672-2680.

Inagaki et al., "Human's Overtrust in and Overreliance on Advanced Driver Assistance Systems: A Theoretical Framework", International Journal of Vehicular Technology, Available Online at: <http://dx.doi.org/10.1155/2013/951762>, 2013, 8 pages.

Kumar et al., "Adaptive Trust Calibration for Level Driving Automation", Proc. IEEE Intelligent Transportation Systems Available Online at: <https://doi.org/10.1145/3334480.3382963>, Sep. 24, 2020, 10 pages.

Li et al., "Investigating the Effects of Age and Disengagement in Driving on Driver's Takeover Control Performance in Highly Automated Vehicles", Transportation Planning and Technology, vol. 42, No. 5, Available online at: <https://doi.org/10.1080/03081060.2019.1609221>, 2019, pp. 470-497.

Liu et al., "Adversarial Learning of Task-Oriented Neural Dialog Models", Available Online at: <https://arxiv.org/abs/1805.11762>, 2018, 10 pages.

Mirza et al., "Conditional Generative Adversarial Nets", Available Online at: <https://arxiv.org/abs/1411.1784>, 2014, 7 pages.

Olsen, Anneli, "The Tobii I-VT Fixation Filter", Tobii Technology, Mar. 20, 2012, 21 pages.

Pal et al., ""Looking at The Right Stuff"—Guided Semantic-Gaze for Autonomous Driving", The IEEE/CVF Conference on Computer Vision and Pattern Recognition (CVPR), 2020, 10 pages.

Tobiipro, "Tobii Pro Lab User Manual", Available Online at: <https://www.tobiipro.com/siteassets/tobii-pro/user-manuals/Tobii-Pro-Lab-User-Manual/>, Aug. 31, 2015, 148 pages.

Wu et al., "Take-Over Performance and Safety Analysis Under Different Scenarios and Secondary Tasks in Conditionally Automated Driving", IEEE, 2019, pp. 136924-136933.

Zhu et al., "Unpaired Image-to-Image Translation using Cycle-Consistent Adversarial Networks", In IEEE International Conference on Computer Vision (ICCV), 2017, 18 pages.

Final Office Action received for U.S. Appl. No. 16/846,081, dated Aug. 17, 2022, 17 pages.

Final Office Action received for U.S. Appl. No. 16/950,820, dated May 17, 2022, 16 Pages.

Non-Final Office Action received for U.S. Appl. No. 16/846,081, dated Mar. 2, 2022, 15 pages.

Non-Final Office Action received for U.S. Appl. No. 16/950,820, dated Dec. 17, 2021, 11 pages.

Notice of Allowance received for U.S. Appl. No. 16/805,607, dated Jan. 27, 2022, 9 pages.

Alahi et al., "Social LSTM: Human Trajectory Prediction in Crowded Spaces", IEEE Conference on Computer Vision and Pattern Recognition (CVPR), Jun. 2016, pp. 961-971.

Alemi et al., "Deep Variational Information Bottleneck", Conference Paper at ICLR 2017, 2017, 19 pages.

Becker et al., "Bosch's Vision and Roadmap Toward Fully Autonomous Driving", Available Online at: <https://doi.org/10.1007/978-3-319-05990-7_5>, 2014, 11 pages.

Bertoni et al., "MonoLoco: Monocular 3D Pedestrian Localization and Uncertainty Estimation", EPFL VITA lab, CH-1015 Lausanne, Aug. 2019, 11 pages.

Bojarski et al., "End to End Learning for Self-Driving Cars", NVIDIA Corporation Holmdel, NJ 07735, Apr. 25, 2016, 9 pages.

Bojarski et al., "Visualbackprop: Visualizing Cnns for Autonomous Driving", Nov. 16, 2016, 13 pages.

Chen et al., "3D Object Proposals for Accurate Object Class Detection", Curran Associates Inc., Advances in Neural Information Processing Systems 28, 2015, pp. 424-432.

Chen et al., "Monocular 3D Object Detection for Autonomous Driving", IEEE Conference on Computer Vision and Pattern Recognition (CVPR), Jun. 2016, pp. 2147-2156.

Chen et al., "Multi-View 3D Object Detection Network for Autonomous Driving", Department of Electronic Engineering, Tsinghua University Baidu Inc., Jun. 22, 2017, 9 pages.

Faria et al., "The Effect of Augmented Reality Cues on Glance Behavior and Driver-initiated Takeover in Conditionally Automated Driving", In AutoUI in Submission, 2020, 15 pages.

(56) References Cited

OTHER PUBLICATIONS

Finn et al., "A Connection Between Generative Adversarial Networks, Inverse Reinforcement Learning, and Energy-Based Models", University of California, Berkeley, Nov. 25, 2016, 10 pages.
Finn et al., "Guided Cost Learning: Deep Inverse Optimal Control via Policy Optimization", University of California, Berkeley, Berkeley, CA 94709 USA, May 27, 2016, 13 pages.
Fu et al., "Learning Robust Rewards with Adversarial Inverse Reinforcement Learning", Conference Paper at ICLR 2018, Department of Electrical Engineering and Computer Science, University of California, 2018, 15 pages.
Geiger et al., "Vision Meets Robotics: The KITTI Dataset", International Journal of Robotics Research (IJRR), 2013, 6 pages.
Gilmer et al., "Neural Message Passing for Quantum Chemistry", Jun. 12, 2017, 14 pages.
Godard et al., "Unsupervised Monocular Depth Estimation with Left-Right Consistency", Available Online at: <http://visual.cs.ucl.ac.uk/pubs/monoDepth/>, Sep. 2016, 14 pages.
Güler et al., "DensePose: Dense Human Pose Estimation in the Wild", In Proceedings of the IEEE Conference on Computer Vision and Pattern Recognition, 2018, pp. 7297-7306.
Gupta et al., "Social GAN: Socially Acceptable Trajectories with Generative Adversarial Networks", Mar. 2018, 10 pages.
Hayakawa et al., "Pedestrian Action Recognition and Localization Using RGB Images and Pose", 2020, 6 pages.
He et al., "Mask R-CNN", Facebook AI Research (FAIR), Jan. 2018, 12 pages.
Hergeth, "Keep Your Scanners Peeled: Gaze Behavior as a Measure of Automation Trust During Highly Automated Driving", Hum Factors 58, Available Online at: <https://doi.org/10.1177/0018720815625744>, May 2016, pp. 509-519.
Hoshen Yedid, "VAIN: Attentional Multi-agent Predictive Modeling", Facebook AI Research, NYC, Sep. 28, 2018, 12 pages.
Itani et al., "Privacy as a Service: Privacy-Aware Data Storage and Processing in Cloud Computing Architectures", Eighth IEEE International Conference on Dependable, Autonomic and Secure Computing, Dec. 2009, pp. 711-716.
Jajodia et al., "A Unified Framework for Enforcing Multiple Access Control Policies", ACM, 1997, 474-485 pages.
Jang et al., "Categorical Reparameterization With Gumbel-Softmax", conference paper at ICLR 2017, Aug. 5, 2017, 13 pages.
Kesting et al., "Enhanced Intelligent Driver Model to Access the Impact of Driving Strategies on Traffic Capacity", Institute for Transport & Economics, Dec. 18, 2009, 20 pages.
Kim et al., "Interpretable Learning for Self-Driving Cars by Visualizing Causal Attention", Computer Science Division University of California, Berkeley Berkeley, CA 94720, USA, Mar. 30, 2017, 9 pages.
Kim et al., "Textual Explanations for Self-Driving Vehicles", EECS, University of California, Berkeley CA 94720, USA MPI for Informatics, Saarland Informatics Campus, 66123 Saarbrucken, Germany AMLab, University of Amsterdam, 1098 XH Amsterdam, Netherlands, Jul. 30, 2018, 24 pages.
Kipf et al., "Neural Relational Inference for Interacting Systems", Jun. 6, 2018, 17 pages.
Kotseruba et al., "Joint Attention in Autonomous Driving (JAAD)", Apr. 2017, 10 pages.
Kreiss et al., "PifPaf: Composite Fields For Human Pose Estimation", In The IEEE Conference on Computer Vision and Pattern Recognition (CVPR), Jun. 2019, 10 pages.
Levine Sergey, "Reinforcement Learning and Control as Probabilistic Inference: Tutorial and Review", UC Berkeley, May 20, 2018, 22 pages.
Li et al., "Actional-Structural Graph Convolutional Networks for Skeleton-based Action Recognition", CVPR, Apr. 2019, 12 pages.
Liu et al., "CBNet: A Novel Composite Backbone Network Architecture for Object Detection", Wangxuan Institute of Computer Technology, Peking University, Department of Computer Science, Stony Brook University, Sep. 2019, 8 pages.
Liu et al., "High-Level Semantic Feature Detection: A New Perspective for Pedestrian Detection", In IEEE Conference on Computer Vision and Pattern Recognition (CVPR), 2019, pp. 5187-5196.
Liu et al., "SSD: Single Shot MultiBox Detector", Springer International Publishing AG, ECCV 2016, Part I, LNCS 9905, 2016, pp. 21-37.
Loper et al., "SMPL: A Skinned Multi-Person Linear Model", ACM Transactions on Graphics, vol. 34, No. 6, Oct. 2015, pp. 1-16.
Lu et al., "Eye Tracking: A Process-Oriented Method for Inferring Trust in Automation as a Function of Priming and System Reliability", IEEE, Transactions on Human-Machine Systems, Available online at: <https://doi.org/10.1109/THMS.2019.2930980>, Dec. 2019, pp. 560-568.
Magassouba et al., "Understanding Natural Language Instructions for Fetching Daily Objects Using GAN-Based Multimodal Target-Source Classification", Available Online at: <https://arxiv.org/abs/1906.06830>, 2017, 8 pages.
Maltz et al., "Imperfect In-vehicle Collision Avoidance Warning Systems Can Aid Distracted Drivers", Transportation Research Part F: Traffic Psychology and Behaviour Available Online at: <https://doi.org/10.1016/j.trf.2007.01.002>, 2007, pp. 345-357.
Peng et al., "Variational Discriminator Bottleneck: Improving Imitation Learning, Inverse RL and GANs by Constraining Information Flow", University of California, Berkeley, Dec. 29, 2018, 27 pages.
Ramanishka et al., "Toward Driving Scene Understanding: A Dataset for Learning Driver Behavior and Causal Reasoning", In Conference on Computer Vision and Pattern Recognition, 2018, 9 pages.
Rasouli et al., "Pedestrian Action Anticipation Using Contextual Feature Fusion in Stacked RNNs", BMVC, 2019, 13 pages.
Redmon et al., "YOLOv3: An Incremental Improvement", University of Washington, Apr. 2018, 6 pages.
SAE International, "Taxonomy and Definitions for Terms Related to On-Road Motor Vehicle Automated Driving Systems", Available Online at: <https://www.sae.org/news/3544/>, 2014, 35 pages.
Schatzmann et al., "A Survey of Statistical User Simulation Techniques for Reinforcement-Learning of Dialogue Management Strategies", The Knowledge Engineering Review, Available Online at: <https://doi.org/10.1017/S0269888906000944>, Jun. 2006, 33 pages.
Si et al., "An Attention Enhanced Graph Convolutional LSTM Network for Skeleton-Based Action Recognition", Mar. 2019, 10 pages.
Steenkiste, "Relational Neural Expectation Maximization: Unsupervised Discovery of Objects and Their Interactions", Conference Paper at ICLR 2018, Feb. 28, 2018, 15 pages.
Sukhbaatar et al., "Learning Multiagent Communication with Backpropagation", 29th Conference on Neural Information Processing Systems (NIPS 2016), Barcelona, Spain., Oct. 31, 2006, 12 pages.
Sun et al., "Probabilistic Prediction of Interactive Driving Behavior via Hierarchical Inverse Reinforcement Learning", Sep. 9, 2018, 7 pages.
Tang et al., "Disturbance-Observer-Based Tracking Controller for Neural Network Driving Policy Transfer", IEEE Transactions on Intelligent Transportation Systems, Dec. 5, 2019, 12 pages.
Tawari et al., "Learning to Attend to Salient Targets in Driving Videos Using Fully Convolutional RNN", 21st International Conference on Intelligent Transportation Systems (ITSC), 2018, 8 pages.
Toshev et al., "DeepPose: Human Pose Estimation via Deep Neural Networks.", IEEE Conference on Computer Vision and Pattern Recognition, 2014, pp. 1653-1660.
Van Dijk et al., "On the Impossibility of Cryptography Alone for {Privacy-Preserving} Cloud Computing", 5th USENIX Workshop on Hot Topics in Security (HotSec 10), 2010, 8 pages.
Velickovic et al., "Graph Attention Networks", Conference Paper at ICLR 2018, Feb. 4, 2018, 12 pages.
Wang et al., "Temporal Segment Networks: Towards Good Practices for Deep Action Recognition", Aug. 2016, 16 pages.
Wei et al., "Convolutional Pose Machines", CVPR, 2016, 9 pages.
Wojke et al., "Simple Online and Realtime Tracking With a Deep Association Metric", IEEE International Conference on Image Processing (ICIP), 2017, pp. 3645-3649.

(56) References Cited

OTHER PUBLICATIONS

Wu et al., "Drivers' Attitudes and Perceptions towards a Driving Automation System with Augmented Reality Human-Machine Interface", Proc. IEEE Intelligent Vehicles Symposium, Available Online at: <https://doi.org/10.1109/IV47402.2020.9304717>, 2020, 6 pages.
Xia Qi, "MeDShare: Trust-Less Medical Data Sharing Among Cloud Service Providers via Blockchain", IEEE, vol. 5, Jul. 24, 2017, 14757-14767 pages.
Yan et al., "Spatial Temporal Graph Convolutional Networks for Skeleton-Based Action Recognition", Department of Information Engineering, The Chinese University of Hong Kong, Jan. 2018, 10 pages.
Yang et al., "3D Human Pose Estimation in the Wild by Adversarial Learning", IEEE/CVF Conference on Computer Vision and Pattern Recognition, 2018, pp. 5255-5264.
Yu et al., "Multi-Agent Adversarial Inverse Reinforcement Learning", Jul. 30, 2019, 13 pages.
Zhang, "CityPersons: A Diverse Dataset for Pedestrian Detection", Feb. 2017, 12 pages.
Zheng et al., "Mars: A Video Benchmark for Large-Scale Person Re-Identification", In Computer Vision—ECCV 2016, Sep. 2016, pp. 868-884.
Zhou et al., "Temporal Relational Reasoning in Videos", Jul. 2018, 16 pages.
Zhu et al., "StarNet: Pedestrian Trajectory Prediction using Deep Neural Network in Star Topology", Jun. 2019, 6 pages.
Ziebart et al., "Maximum Entropy Inverse Reinforcement Learning", School of Computer Science Carnegie Mellon University Pittsburgh, PA 15213, Proceedings of the Twenty-Third AAAI Conference on Artificial Intelligence, 2008, 6 pages.
Notice of Allowance received for U.S. Appl. No. 16/950,820, dated Oct. 21, 2022, 5 pages.
Notice of Allowance received for U.S. Appl. No. 16/846,081, dated Dec. 7, 2022, 8 pages.
Bolstad et al., "Measurement of Situation Awareness for Automobile Technologies of the Future", Performance Metrics for Assessing Driver Distraction: the Quest for Improved Road Safety, 2010, 18 pages.
Endsley, Mica R., "A Systematic Review and Meta-Analysis of Direct Objective Measures of Situation Awareness: A Comparison of SAGAT and SPAM", Human factors, doi: 10.1177/0018720819875376, Available online at: <http://www.ncbi.nlm.nih.gov/pubmed/31560575>, Sep. 2019, pp. 124-150.
Gabbard et al., "AR DriveSim: An Immersive Driving Simulator for Augmented Reality Head-Up Display Research", Frontiers for Augmented Reality Head-Up Display Research, Frontiers in Robotics and AI, vol. 6, Available online at: <https://www.frontiersin.org/article/10.3389/frobt.2019.00098/full>, Oct. 23, 2019, 16 pages.
Gregoriades et al., "Simulation-Based Evaluation of an In-Vehicle Smart Situation Awareness Enhancement System", Ergonomics, vol. 61, No. 7, Available online at: <https://www.tandfonline.com/doi/full/10.1080/00140139.2018.1427803>, 2018, 24 pages.
Just et al., "A Theory of Reading: From Eye Fixations to Comprehension", Psychological Review, vol. 87, No. 04, Jul. 1980, pp. 329-354.
Kim et al., "Assessing Distraction Potential of Augmented Reality Head-Up Displays for Vehicle Drivers", Human Factors: The Journal of the Human Factors and Ergonomics Society, Available online at: <http://journals.sagepub.com/doi/10.1177/0018720819844845>, May 2019, 14 pages.
Kim, Hyungil, "Augmented Reality Pedestrian Collision Warning: An Ecological Approach to Driver Interface Design and Evaluation", PhD Dissertation, Virginia Tech., Sep. 29, 2017, 144 pages.
Kim et al., "Toward Prediction of Driver Awareness of Automotive Hazards: Driving-Video-Based Simulation Approach", Proceedings of the Human Factors and Ergonomics Society Annual Meeting, vol. 63, No. 1, Available online at: <http://journals.sagepub.com/doi/10.1177/1071181319631003>, Nov. 2019, pp. 2099-2103.
Kim et al., "Toward Real-Time Estimation of Driver Situation Awareness: An Eye Tracking Approach based on Moving Objects of Interest", 2020 IEEE Intelligent Vehicles Symposium (IV), doi: 10.1109/IV47402.2020.9304770, 2020, pp. 1035-1041.
Kim et al., "Virtual Shadow: Making Cross Traffic Dynamics Visible Through Augmented Reality Head Up Display", Proceedings of the Human Factors and Ergonomics Society, SAGE Publications, 2016, pp. 2093-2097.
Koenderink et al., "Spatial and Temporal Parameters of Motion Detection in the Peripheral Visual Field", Journal of the Optical Society of America A, vol. 2, No. 2, Available online at: <https://www.osapublishing.org/abstract.cfm?URI=josaa-2-2-252>, Feb. 1985, pp. 252-259.
Martin et al., "Dynamics of Driver's Gaze: Explorations in Behavior Modeling & Maneuver Prediction", IEEE Transactions on Intelligent Vehicles, vol. 3, No. 2, Feb. 2018, 10 pages.
Moore et al., "Development of a Novel Measure of Situation Awareness: The Case for Eye Movement Analysis", Proceedings of the Human Factors and Ergonomics Society Annual Meeting, vol. 54, No. 19, Available online at: <http://journals.sagepub.com/doi/10.1177/154193121005401961>, Sep. 2010, pp. 1650-1654.
Rayner et al., "Eye Movements", Scholarpedia, vol. 2, No. 10, Available online at: <http://www.scholarpedia.org/article/Eye movements> [Retrieved Mar. 17, 2022], 2007, 11 pages.
Rucci et al., "Fixational Eye Movements and Perception", Vision Research, Jan. 2016, pp. 1-4.
Rushton et al., "Behavioral Development and Construct Validity: The Principle of Aggregation", Psychological Bulletin, vol. 94, No. 1, Jul. 1983, pp. 18-38.
Sethumadhavan, Arathi, "Knowing What You Know: The Role of Meta-Situation Awareness in Predicting Situation Awareness", Proceedings of the Human Factors and Ergonomics Society Annual Meeting, vol. 55, No. 1, Available online at: <http://pro.sagepub.com/lookup/doi/10.1177/1071181311551074>, Sep. 2011, pp. 360-364.
Strasburger et al., "Peripheral Vision and Pattern Recognition: A Review", Journal of Vision, vol. 11, No. 5, 2011, pp. 1-82.
Tobii Technology, "Tobii Glasses Eye Tracker User Manual", Danderyd, Sweden: Tobii Technology AB, 2012, 70 pages.
Vondrick et al., "Efficiently Scaling Up Crowdsourced Video Annotation", International Journal of Computer Vision, vol. 101, No. 1, Jan. 2013, 22 pages.
Wickens et al., "Modeling of Situation Awareness Supported by Advanced Flight Deck Displays", Proceedings of the Human Factors and Ergonomics Society Annual Meeting, vol. 51, No. 12, Available online at: <http://journals.sagepub.com/doi/10.1177/154193120705101204>, Oct. 2007, pp. 794-798.
Winter et al., "Situation Awareness Based on Eye Movements in Relation to the Task Environment", Cognition, Technology and Work, 2019, 14 pages.
Non-Final Office Action received for U.S. Appl. No. 17/013,482, dated Oct. 4, 2023, 10 pages.

\* cited by examiner

TOWARD SIMULATION OF DRIVER BEHAVIOR IN DRIVING AUTOMATION

FIELD OF THE DISCLOSURE

This disclosure relates generally to simulating driver behavior with a driver simulation model and/or using the simulated driving behavior to optimize and/or improve advanced driving assistance functions.

BACKGROUND OF THE DISCLOSURE

Artificial intelligence and deep learning have been utilized to provide driving automation to an operator of a vehicle via advanced driving assistance functions, and thus allowing for an operator's workload to be reduced during driving. In spite of the progress artificial intelligence has had on reducing an operator's workload during driving, operators tend to over-rely on the automation, which may cause an operator's reaction time during critical driving moments to be slower.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Some examples of the disclosure are directed to a method including obtaining one or more characteristics of one or more driving scenes. In some examples, the method may include simulating, via a machine learning model, one or more behaviors of a simulated driver based at least on the one or more characteristics. In some examples, the method may include performing an operation associated with one or more advanced driving assistance system (ADAS) functions based at least on the simulated one or more behaviors.

Some examples of the disclosure are directed to a non-transitory computer-readable storage medium storing instructions, which when executed by one or more processors of an electronic device, cause the electronic device to perform a method. In some examples, the method includes obtaining one or more characteristics of one or more driving scenes. In some examples, the method includes simulating, via a machine learning model, one or more behaviors of a simulated driver based at least on the one or more characteristics. In some examples, the method includes performing an operation associated with one or more advanced driving assistance system (ADAS) functions based at least on the simulated one or more behaviors.

Some examples of the disclosure are directed to an electronic device including one or more processors, and memory storing instructions, which when executed by the one or more processors, cause the electronic device to perform a method. In some examples, the method includes obtaining one or more characteristics of one or more driving scenes. In some examples, the method includes simulating, via a machine learning model, one or more behaviors of a simulated driver based at least on the one or more characteristics. In some examples, the method includes performing an operation associated with one or more advanced driving assistance system (ADAS) functions based at least on the simulated one or more behaviors.

DETAILED DESCRIPTION

In the following description, reference is made to the accompanying drawings which form a part hereof, and in which it is shown by way of illustration specific examples that may be practiced. It is to be understood that other examples may be used and structural changes may be made without departing from the scope of the examples of the disclosure.

Generally, drivers utilizing automated driving technology (e.g., advanced driving assistance system (ADAS) functions) may be less attentive when compared to drivers that do not utilize the automated driving technology. This over-reliance on automated driving technology may lead to and cause serious injury to a driver and/or other individuals. The drivers that utilize ADAS functions while driving, particularly ADAS functions that provide partial driving assistance (e.g., ADAS functions of SAE autonomy level 2), may not fully account for constraints and limitations of the system's functions during use. This circumstance may lead to drivers removing their focus from the driving environment and/or from monitoring the status of the ADAS functions, and shifting their focus elsewhere. Therefore, it may be important for ADAS functions to not only provide appropriate assistance to a driver, but also provide appropriate assistance while considering the driving environment in which it is operating and/or the behavior of the driver.

Simulating a driver's behavior may allow ADAS functions to learn from simulated interactions of a driver's behavior before real interactions between drivers and the ADAS functions occur. For example, ADAS functions that utilize simulated driver behavior may learn from and be exposed to driving behaviors and/or driving conditions that would have otherwise needed to be learned once operationalized (e.g., operationalized in an online system). ADAS functions that learn from simulated driver behavior prior to learning from driving interactions of real drivers may be considered offline learning or offline optimization. One or more of the examples of this disclosure are directed to utilizing driver simulation to optimize and/or improve ADAS functions.

Figure 1:
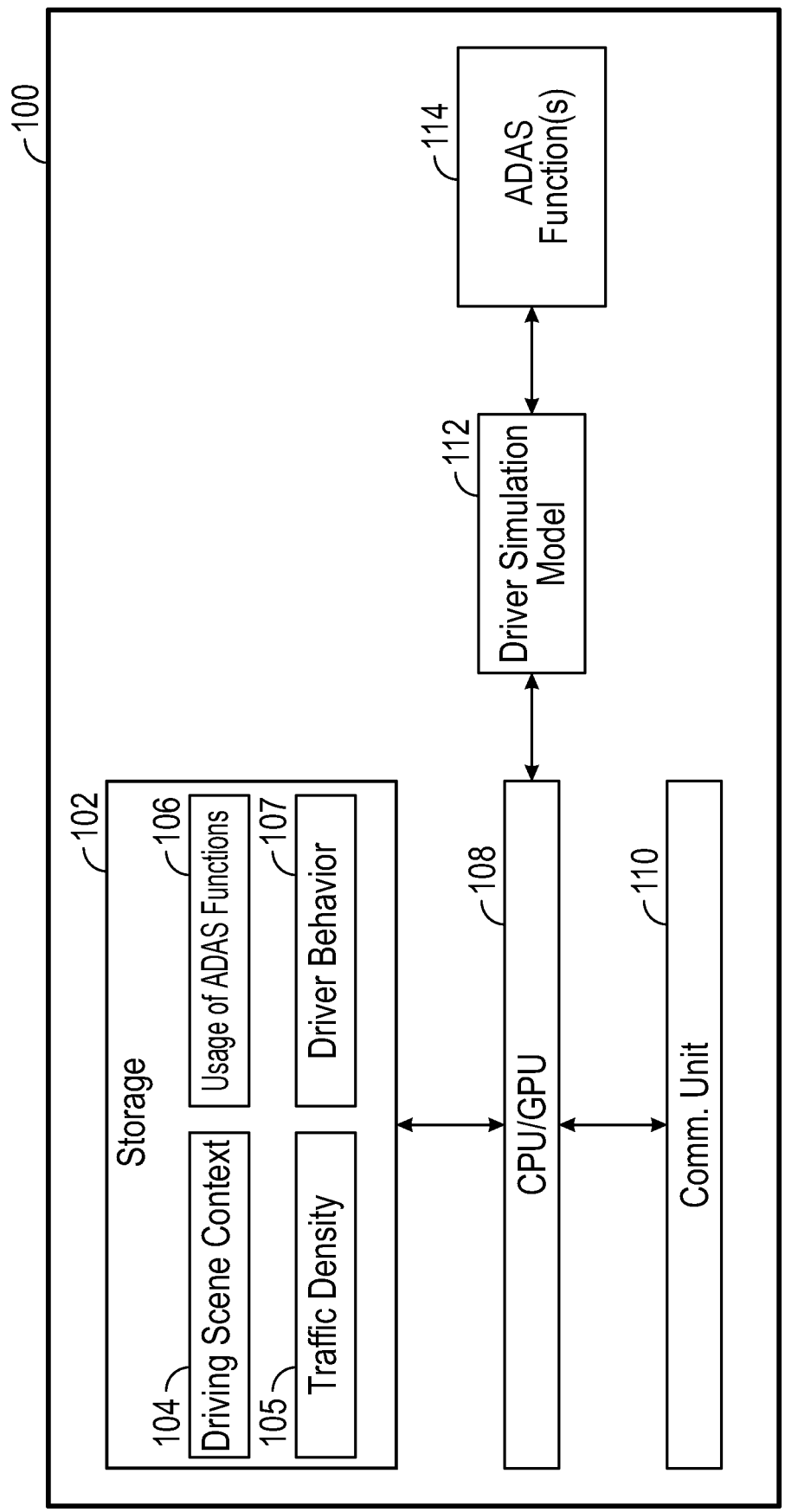
FIG. 1 is a schematic view of an exemplary computing system for optimizing and/or improving one or more advanced driving assistance system (ADAS) functions in an offline environment, according to examples of the disclosure.

FIG. 1 is a schematic view of an exemplary computing system 100 for optimizing one or more advanced driving assistance system (ADAS) functions in an offline environment, according to examples of the disclosure. The components of the computing system 100, as well as the components of other systems, hardware architectures, software architectures discussed herein, may be combined, omitted, or organized into different architectures for various examples.

Generally, the computing system 100 may include one or more processors (CPU/GPU 108) that execute one or more applications, operating systems, instructions, among others. The CPU/GPU 108 may also execute various instructions related to simulating driver behavior (driver simulation model 112) including instructions for training generative models, such as the conditional generative adversarial network (GAN) that will be described in FIG. 3. In some examples, training the driver simulation model 112 may include, but may not be limited to, computing model weights, computing loss and activation functions, updating gradients, performing matrix operations, calculating model metrics (e.g., model accuracy, error rate, etc.), collecting data for batch input, and the like.

In some examples, the CPU/GPU 108 may include a respective microprocessor, one or more application-specific integrated circuits(s) (ASIC) or other similar devices. The CPU/GPU 108 may also include respective internal processing memory, an interface circuit, and bus lines for transferring data, sending commands, and communicating with the plurality of components of computing system 100 (e.g., storage 102 and communication unit 110). The CPU/GPU 108 may also include a respective communication device (not shown) for sending data internally to components of computing system 100 and/or may include a communication unit 110 for communicating with externally hosted computing systems (e.g., external to the computing system 100). For example, before and/or during the simulation of one or more behaviors of a driver, the driver simulation model 112 may communicate, via communication unit 110, with one or more external storage units (not shown) to retrieve one or more driving scenes and/or driving conditions (e.g., characteristics of one or more driving scenes). In some examples, communication unit 110 may be any appropriate device that facilities communications between computing systems, such as a network communications device.

In an exemplary embodiment, CPU/GPU 108 may additionally communicate with a storage unit 102 (e.g., memory, such as computer-readable storage medium that stores instructions for the various functions or applications implemented by computing system 100) to execute one or more applications, operating systems, instructions, and the like that are stored on the storage unit 102. In some embodiments, the storage unit 102 may be accessed by the CPU/GPU 108 while training the driver simulation model 112. For example, the driver simulation model 112 may retrieve from the storage unit 102: one or more driving scene context(s) 104, one or more characteristics associated with a traffic density 105 of driving scene 104, one or more characteristics associated with usage of the one or ADAS functions 106 during the driving scene 104, and/or one or more characteristics of driver behavior 107 during the driving scene 104 (e.g., obtaining one or more characteristics of one or more driving scenes), which will be discussed in more detail later. In some examples, the storage unit 102 may also store information associated with intermediate computations while training the driver simulation model 112. In some embodiments, the storage unit 102 may also store artifacts of the driver simulation model 112 (e.g., outputs of the driver simulation model 112), including, but not limited to, simulated driver behavior data, simulated vehicle data, simulated driving scene data, trained weights of driver simulation model 112 (e.g., parameters of the driver simulation model other than simulated driver behavior and simulated driving scenes), and the like.

As will be described in detail later, the driver simulation model 112 may take as input a driving scene context (e.g., one or more driving scenes and the one or more characteristics of one or more driving scenes), and through a series of computations and transformations (e.g., the layers of driver simulation model 112 discussed in FIG. 3) produce as output simulated driver behavior (e.g., simulated behavior of a simulated driver) and/or simulated vehicle behavior including, but not limited to, vehicle speed, vehicle acceleration, automation status (e.g., whether the one or more ADAS functions 114 requires driver intervention (take-over)), and/or gaze behavior of the driver.

The weights of a trained driver simulation model 112 may cause the simulated vehicle and driver behaviors to change based on a change in a driving scene context. For example, the driving scene context 104 may include measures/characteristics associated with traffic density, intersection complexity, and/or reliance on one or more ADAS functions 114 during the driving scene 104, and a change in one of these measures may not have a significant change on the outputted simulated driver behavior, simulated vehicle automation status, or simulated gaze of a driver (e.g., a low weight value for the changed measure) for the respective driving scene. However, a change in a different measure/characteristic of the driving scene context 104 may have a more significant change on the outputted simulated behavior (e.g., a high weight value for that respective measure of the respective driving scene). In other words, a low weight value or a high weight value for a respective driving scene measure may influence how driving simulation model 112 transforms the respective driving scene to simulated driver and vehicle behavior.

The ADAS functions 114 may be optimized (e.g., improve ADAS functions 114) based on the artifacts produced by the driver simulation model 112. In some embodiments, one or more machine learning models of the ADAS functions 114 may optimize their behavior based on the trained weights of the driver simulation model 112 (e.g., use one or more parameters of the driver simulation model, other than the simulated driver and vehicle behaviors, to improve the ADAS functions 114), which will be discussed in more detail later. For example, the one or more ADAS functions 114 may include an ADAS function configured to provide automatic emergency braking (AEB) for a vehicle based on parameters of the real-time situation including traffic density, intersection complexity, and vehicle acceleration, among other parameters. Each of these parameters of the real time situation may have an initial weight of importance in the respective machine learning models when determining whether to provide emergency braking to a vehicle (e.g., weight of importance prior to being optimized by driver simulation model 112), and according to the computed importance of these factors during the driver simulation model (e.g., trained weights of the driver simulation model 112), the respective machine learning models of the AEB function may modify its parameters (and/or may have its parameters optimized by an external system, such as by processors 108) to have a second weight of importance.

That is, when simulating the driver behavior for one or more driving scenes of interest, the weights of the trained driver simulation model 112 may determine that certain driving scene parameters (e.g., characteristics of a driving scene such as intersection complexity, vehicle acceleration, traffic density, etc.) may have a second weight of importance when mapping the driving scene to the simulated driver and vehicle behavior. The models of the ADAS function 114 that provides AEB functionality to a driver may update its weights to correspond to the same order of importance of the trained weights of the driver simulation model 112. In some embodiments, this may allow ADAS functions 114 and/or respective models of the ADAS functions 114, like the AEB function, to prioritize parameters that have been found to be of greater importance when simulating driver behavior (e.g., using parameters, other than simulated driver and vehicle behavior to update the parameters of one or more models associated with a respective ADAS function).

In some embodiments, the ADAS functions 114 may also be optimized by learning additional driving scenes and learning the simulated driver interactions associated with the additional driving scenes. As discussed above, the driver simulation model 112 may take as input a driving scene context and produce as output corresponding simulated driver behavior (e.g., simulating behaviors of a simulated driver using characteristics of a driving scene context, via a machine leaning model such as the driver simulation model 112). This may allow ADAS functions 114 to learn new driving scenes that it may not have previously been trained on. For example, the ADAS functions 114 may include an ADAS function that provides a lane keeping assistance system (LKAS) functionality to a driver of a vehicle for a first set of driving scenes. The ADAS functions 114 may be further optimized to provide LKAS functionality for a first set and a second set of driving scenes by simulating the behaviors of a driver for the second set of driving scenes, and providing those simulated interactions to the ADA functions 114. In some embodiments, the ADA functions 114 may then additionally train on the second set of simulated driver data, and after completion of training, provide LKAS functionality to a driver for the first set and the second set of driving scenes (e.g., improving the LKAS function by re-training models associated with the LKAS function using the simulated behaviors and characteristics of one or more driving scenes). After optimizing the one or more ADAS functions in an offline environment, the one or more optimized ADAS functions 114 may be operationalized in a real-time (i.e., online) system.

Figure 2:
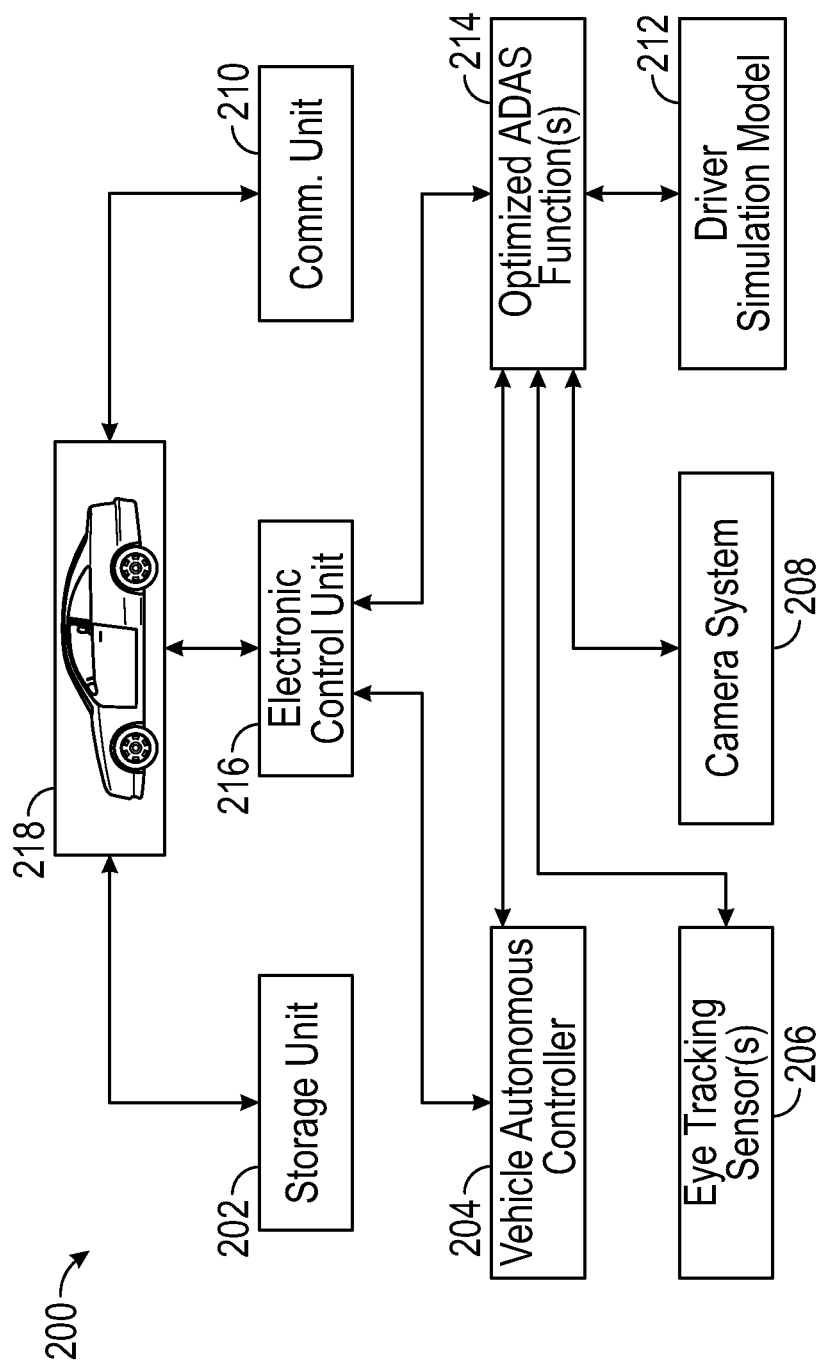
FIG. 2 is a schematic view of an exemplary system for providing real time intervention and/or assistance to a driver by utilizing one or more optimized and/or improved ADAS functions.

FIG. 2 is a schematic view of an exemplary system 200 for providing real time intervention and/or assistance to a driver by utilizing one or more optimized and/or improved ADAS functions (e.g., as described with reference to FIG. 1). Generally, the system 200 may include a vehicle 218 with an electronic control unit (ECU) 216 that executes one or more applications, operating systems, vehicle systems and subsystem user interfaces, among others. The ECU 216 may also execute one or more optimized and/or improved ADAS functions 214 that are configured to provide real time or near real time assistance and/or intervention to a driver of a vehicle 218. The optimized ADAS functions 214 may have been optimized in an offline system to have modified weights and/or have been trained on additional driving scenes, as discussed in FIG. 1. The optimized ADAS functions 214 may include one or more level 2 advanced driving assistance functions as defined by the Society of Automotive Engineers (SAE) such as adaptive cruise control (ACC), forward collision warning (FCW), advanced emergency braking (AEB), pedestrian detection (PD), traffic sign recognition (TSR), lane departure warning (LDW), driver monitor (DM), among other SAE level 2 autonomous driving functions. These example advanced driving assistance functions may use one or more machine learning models and/or deep learning models to respond to observed driving events, objects, and/or hazards. ADAS functions other than SAE level 2 may also be optimized in the same manner as described above (e.g., SAE levels such as levels 3-5).

In some embodiments, in response to observing a driving scene and/or a driver's gaze from the camera system 208 (and/or other sensor system that is able to detect one or more characteristics of a physical environment of the vehicle 218) and/or the eye tracking sensor(s) 206, the optimized ADAS functions 214 may make use of its optimized weights and/or improved ability to operate in new driving scenes to perform one or more predictions about the driver's awareness, driver's behavior, and/or likelihood of responding to a detected road object/road hazard. For example, one or more optimized machine learning models of a pedestrian detection function (e.g., models associated with a respective ADAS function) may take inputs associated with the visibility of a driver and/or complexity of an intersection, and through a series of transformations and computations, the optimized weights of the PD model(s) may output a score of the driver's likely awareness of a detected pedestrian (e.g., estimated gaze location of the driver). Based on the outputs of the respective machine learning/deep learning PD model(s), the vehicle autonomous controller 204 may be configured to alter the semi-autonomous operation of one or more driving functions of the vehicle 218 (e.g., braking, turning, acceleration, displaying notifications in a heads up display unit of the vehicle, etc.).

The ECU 216 of the vehicle 218 may execute one or more applications—including the optimized ADAS function(s) 214—operating systems, vehicle systems and subsystem executable instructions, among others. In some examples, the ECU 216 may include a respective microprocessor, one or more application-specific integrated circuits(s) (ASIC), or other similar devices. The ECU 216 may also include respective internal processing memory, an interface circuit, and bus lines for transferring data, sending commands, and communicating with the plurality of components of vehicle 218. The ECU 216 may also include a respective communication device (not shown) for sending data internally to components of the vehicle 102 and communicating with externally hosted computing systems (e.g., external to vehicle 218).

In some embodiments, the ECU 104 may additionally communicate with a storage unit 202 (e.g., memory, such as computer-readable storage medium that stores instructions for the various functions or applications implemented by the system 200) to execute one or more applications, operating systems, vehicle systems, subsystem user interfaces, and the like that are stored on the storage unit 202. In one or more embodiments, the storage unit 202 may be accessed by the optimized ADAS functions 214 to retrieve and/or store data. In some embodiments, the optimized ADAS functions 214 may retrieve from the storage unit 202 one or more measures for one or more time periods of interest. For example, a machine learning model of a respective ADAS function may take as input stored data from camera system 208 and/or eye tracking sensors 206 over one or more time periods of interest and produce as output a prediction corresponding to the driver's awareness of one or more road objects and/or hazards of interest.

In some embodiments, the machine learning models of the optimized ADAS functions 214 may also modify their respective weights and/or train on new driving scenes in response to observing unfamiliar driving scenes (e.g., detecting one or more characteristics of a unfamiliar driving scene using one or more sensors of a vehicle while the vehicle is in operation). For example, the optimized ADAS functions 214, and more specifically, the respective machine learning models of the optimized ADAS functions 214, may have computed a prediction in low-confidence about a driver's awareness to a driving event, road object, and/or likelihood of avoiding a respective road hazard. This low confidence prediction may, at times, be attributed to the advanced driving assistance model being unfamiliar with a particular driving environment (e.g., experiencing a driving environment different from the normal operating environment) and/or unfamiliar road hazard(s) (e.g., experiencing different road objects and hazards than the normally observed road hazards). When a low confidence prediction is made, the driver simulation model 212 may take as input the unfamiliar driving scene and produce as output simulated driver behavior and/or vehicle behavior for the unfamiliar driving scene. When the driver simulation model 212 has finished simulating the driver behavior for the unfamiliar driving scene, the simulated interactions and behaviors may be stored in the storage unit 202. The machine learning models of the respective ADAS functions 214 may then update their weights and/or train on the newly simulated driver and vehicle behavior stored in the storage unit 202 in a similar way as discussed in FIG. 1.

In some embodiments, after obtaining real-time characteristics of a driving scene from the one or more sensors of a vehicle, the driver simulation model 212 may simulate the behavior of a driver for that driving scene (e.g., before the optimized ADAS function(s) and machine learning model(s) of the respective ADAS function(s) perform respective operation(s)/prediction(s) related to the observed driving scene). In one or more embodiments, based on the simulated behavior produced for the driving scene (by driver simulation model 212), the operational state of one or more ADAS functions may be adjusted. For example, when the driving scene was observed, an ADAS function such as adaptive cruise control (among other ADAS functions) may have been in an active state, and based on the simulated driver behavior it may have been simulated that the attention (e.g., gaze of a driver) may not be focused on the ahead vehicles. This may cause the ECU 216 to adjust the operation of the adaptive cruise control to be placed in a de-activated state, and further cause the activation of one or more other ADAS functions such as a lane departure alert function.

In some embodiments, adjusting the operation of the ADAS functions may also be based on future driving scene characteristics that are obtained from path planning and/or navigation modules of a vehicle. In one or more embodiments, based on the simulated future behavior of a driver (by the driver simulation model 212), the operation of the one or more ADAS functions may also be adjusted. For example, while obtaining future driving scene characteristics from the path planning module of the vehicle, it may be simulated that the driver will maintain or increase a current speed of the vehicle for the future driving scene. It may be determined by the path planning/navigation module that a speed of the vehicle below the current speed is desired for the future driving scene, and because the simulated behavior of the driver did not indicate that the driver will be reducing the speed of the vehicle, the ECU 216 may activate an ADAS function to reduce the speed of the vehicle prior to entering the future driving scene.

In some examples, the ECU 216 may be configured to communicate with the vehicle autonomous controller 204 of the vehicle 218 to execute autonomous driving commands to operate the vehicle 218 to autonomously control one or more driving functions of the vehicle 218. The one or more driving functions may include, but are not limited to, steering, braking, accelerating, merging, turning, coasting, and the like. In some examples, the optimized ADAS functions 214 may communicate with the vehicle autonomous controller 204 to control an autonomous operation of one or more driving functions of the vehicle 218. In some examples, the optimized ADAS functions 214 may be configured to communicate with the vehicle autonomous controller 204 to provide autonomous operation of one or more driving functions of the vehicle 218 to account for one or more external factors that may include, but are not limited to, road/pathway conditions of which the vehicle 218 is traveling, a lane in which the vehicle 218 is traveling, status of traffic signals, traffic patterns, traffic regulations, pedestrian actions in an environment of the vehicle, other vehicle actions in an environment of the vehicle, pedestrian location in an environment of the vehicle, other vehicle locations in an environment of the vehicle, etc.

In some examples, the ECU 216 may additionally be configured to operably control a camera system 208 of the vehicle 218 (and/or other sensor system capable of detecting one or more characteristics of a physical environment of the vehicle 218). The camera system 208 may include one or more cameras (not shown) that are positioned at one or more positions on or in vehicle 218 to capture images of at least the external surrounding environment of the vehicle 218. In particular, the one or more cameras that are positioned in or on the vehicle may be configured to capture images of intersections, vehicles, pedestrians, and convert and/or transform these images to a format that may be accepted by the optimized ADAS functions 214, as will be described later. The ECU 216 may also be configured to communicate with other systems (not shown) to retrieve information associated with vehicle braking, steering, speed, acceleration, velocity, and the like, and convert/transform the retrieved information to a format that may be accepted by the ADAS functions 214.

In some examples, the one or more cameras that are positioned to capture the external surrounding environment of the vehicle 218 may be disposed at one or more external front portions of the vehicle 218. The one or more cameras of the camera system 208 may be disposed at external front portions of the vehicle 218, including, but not limited to different portions of the vehicle bumper, vehicle front lighting units, vehicle fenders, and the windshield. In some examples, the one or more cameras may be configured as RGB cameras that may capture RGB bands that are configured to capture rich information about object appearance, as well as relationships and interactions between the vehicle 218 and objects (e.g., pedestrians) within the surrounding environment of the vehicle 218. In some examples, the one or more cameras may be monocular cameras, outputs from each may be provided as input to one or more ADAS functions 214.

In some examples, the ECU 104 may additionally be configured to operably control eye tracking sensors 206. Eye tracking sensors 206 may include one or more eye tracking sensors positioned to detect the presence, attention, and/or focus of the driver. The eye tracking sensors 206 may include a plurality of cameras (not shown). The cameras may take images or projections of the driver's eyes, and determine the gaze points of the driver. Similar, to the collected data from the camera system 208, the output of eye tracking sensors 206 may be used as input to the one or more optimized ADAS functions 214 to perform one or more predictions about the driver. Other systems and sensors of the vehicle (not shown), may also be used to capture and share the characteristics of the driver to the one or more optimized ADAS functions 214, such as the hand locations of a driver, noise level of a vehicle, and/or the activities being performed by a driver (e.g., inputting information into a GPS, adjusting the radio, talking on a cellphone, etc.).

Further, in some examples, respective machine learning models for one or more optimized ADAS functions 214 may be executed on a remote server (e.g., with one or more processors and memory), which may communicate with ECU 216 via communications unit 210, from which the ECU 216 may receive appropriate information for proper operation of ADAS functions 214.

As discussed above, the weights of a trained driver simulation model and/or the simulated behavior of a driver for additional driving scenes (e.g., synthetic driving scenes) may be used to optimize and/or train one or more machine learning models of one or more ADAS functions. An exemplary driver simulation model and architecture that may compute these respective weights and/or the simulated driver behavior will now be discussed.

Figure 3:
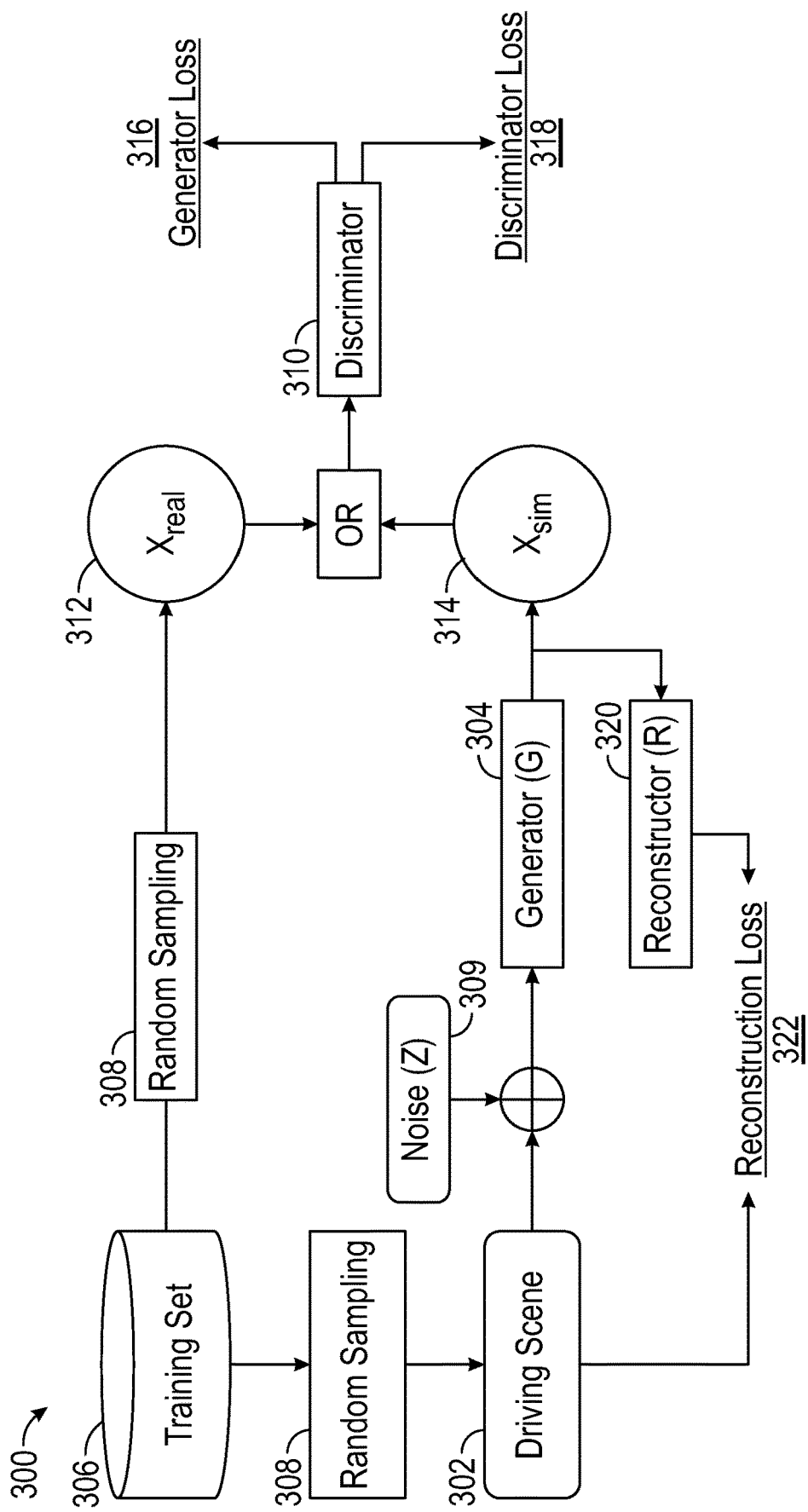
FIG. 3 illustrates an exemplary architecture of a driver simulation model, according to examples of the disclosure.

FIG. 3 illustrates an exemplary architecture of a driver simulation model, according to examples of the disclosure. In some embodiments, the driver simulation model (e.g., driver simulation model 112 and 212) may be a conditional generative adversarial network (GAN) 300. In other embodiments, the driver simulation may be a generative model other than a conditional GAN such as auto encoder models, sequence models, etc.

The conditional GAN 300 may include a generator 304, which may take a driving scene 302 as input and output simulated behavior including driving behaviors and/or the status of one or more ADAS functions corresponding to the driving scene 302. In an exemplary embodiment, the generator 304 may apply the driving scene 302 to various model layers including a two-layer gated recurrent unit (GRU) with a single fully connected (FC) layer. In some embodiments, the FC layer may be followed by two branching layers for outputting the simulated driver behavior: the first branching layer being a FC layer with sigmoid activation for outputting simulated speed, acceleration, and/or automation status of one or more ADAS functions for the provided driving scene 302, and the second branching layer being a FC layer with soft max activation for outputting a driver's simulated gaze behavior. In some embodiments, the unit size of each GRU may be set to 32 units, and the FC may be a unit size of 20 units. In some embodiments, layers other than the output branching layers use a rectified linear unit as their activation functions.

The driving scene 302 may be represented as a vector whose components may include various driving, traffic, and/or vehicle conditions. In some embodiments, the components of the driving scene vector may include, but are not limited to, traffic density, intersection complexity, and/or reliance on one or more ADAS functions during the driving scene, which will be discussed below.

The driving scene 302 (provided as input to the generator 304) may be obtained from the training set 306 that is stored in a storage unit (e.g., a storage unit similar to storage unit 102 or 202), which will be discussed further in FIG. 4. In some embodiments, the driving scene 302 may be selected based on sampling criteria 308 that includes random sampling of driving scenes from the training set 306 and/or selected based on driving scenes that satisfy certain driving conditions of interest (e.g., traffic density is equal to high, number of pedestrians is greater than five, and/or driving automation is off, etc.), among other sampling methods and criteria. Additionally, in some embodiments, before the generator 304 receives the driving scene 302 as input, the vector associated with the driving scene 302 may pass through the noise component 309, which may cause variations in the components of the driving scene 302. In some embodiments, the noise component 309 is represented as a vector and is selected from a normal distribution.

The conditional GAN 300 may be trained in alternating training runs, such that the generator 304 and the discriminator 310 are trained iteratively with a goal of producing a more realistic driving behavior in each subsequent training run. For example, after the noise component 308 is applied to the driving scene 302, the generator 304 may be trained to produce a first set of simulated driving behavior for the driving scene 302. After this training step is completed, the training of the generator 304 may be paused and the discriminator 310 may then be trained. This iterative training may continue until training of the conditional GAN 300 is complete.

The discriminator 310 may take at least two inputs during its training run: (1) simulated driving behavior samples 312 (produced from generator 304), and (2) real driving behavior samples 314 (sampled from the training set 306). In an exemplary embodiment, the discriminator 310 may be a two-layer GRU with each layer being a unit size of 32 units. The two-layer GRU may be followed by an FC layer of 20 units and an output layer. The output layer of the discriminator 310 may be a True/False layer, where the output values are associated with the whether the simulated driving behavior is real or simulated.

In contrast to the goal of the generator 304, which may include generating more realistic driving behaviors for each subsequent training run, the goal of the discriminator 310 may include determining whether a respective driving behavior is real or simulated. In other words, the discriminator may be trained to recognize whether the first set of simulated driving behavior produced by the generator 304 is real or simulated.

At the end of each training run, the generator loss function 316 and/or the discriminator loss function 318 may be computed. The generator loss function 316 may be rewarded when the simulated driving behavior causes the discriminator 310 to incorrectly predict a first set of simulated driving behavior is from the real driving behavior samples 314. In contrast, the generator loss function 316 may be penalized when the simulated driving behavior causes the discriminator to correctly predict the simulated driving behavior is from the simulated driving behavior samples 312.

Similarly, the discriminator loss function 318 may be computed in a similar way. The discriminator loss function 318 may be rewarded when the simulated driving behavior causes the discriminator 310 to correctly predict the simulated driving behavior is from the real driving behavior samples 314. In contrast, the discriminator loss function 318 may be penalized when the simulated driving behavior causes the discriminator to incorrectly predict the simulated driving behavior is from the simulated driving behavior samples 312.

These computed losses may cause the layers (e.g., weights of the layers) of the conditional GAN 300 to be updated based on the gradients and/or parameters of the respective loss functions, which in turn may help produce more realistic simulated driver behaviors in future training runs (e.g., when a second set of simulated driving behavior is produced, a third set of simulated driving behavior is produced, . . . , and a final set of simulated driving behavior is a produced). In some embodiments, the generator loss function 316 and the discriminator loss function 318 may be a sigmoid activation function or a soft max activation function. In some embodiments, the gradients of the loss function and the model parameters may include a learning rate of $5e^{-4}$, $\beta_1=0.99$, $\beta_2=0.9$, and/or a batch size of 64.

In some embodiments, the conditional GAN 300 may also include a re-constructor 320 and re-construction loss function 322. In some scenarios, the generator 304 may learn to output the same driving behavior for any driving scene 302, and the re-constructor 320 may help ensure the simulated driver behavior produced by the generator 304 is dependent on the driving scene input.

To address this, the simulated driver behavior (e.g., output of generator 304) may be provided as input to the re-constructor 320. Similar to the layers of the discriminator 310 and the generator 304, the re-constructor may also include two GRU layers with 32 units, and be followed by a FC layer with 20 units and an output layer for outputting a re-constructed driving scene vector. In an exemplary embodiment, the model parameters and weights of the re-constructor 320 may be pre-trained on the training set 306 and may not be updated during the training of the conditional GAN 300.

The re-constructor 320 may be trained to re-construct a driving scene based on simulated driving behavior produced by the generator 304. The output of the re-constructor (e.g., the re-constructed driving scene vector) may be compared with the driving scene provided as input to the generator 304. This comparison between the re-constructed driving scene and the driving scene inputted to the generator 304 may be represented as the reconstruction loss function 322.

In some embodiments, the reconstruction loss function 322 may also be used for training the generator 304. In one or more examples, the weighted sum of the re-constructor loss function 304 and the generator loss function 316 may be used for updating the weights of the generator 304, in a similar way that was described above. In one or more examples, the weights of the generator 304 may be updated based on the generator loss and reconstruction loss with a 2 to 1 ratio.

After the training of the conditional GAN 300 is completed, the final set of simulated driving behavior may be stored in a storage unit (e.g., storage unit 102 and/or storage unit 202), and the final training weights of conditional GAN 300 that produced the mapping of the driving scene 302 to the final set of simulated driving behaviors may also be stored in a storage unit (e.g., storage unit 102 and/or storage unit 202). These artifacts of the conditional GAN 300 may be used for optimizing the ADAS functions, as discussed in FIGS. 1 and 2.

In some embodiments, if the training set contains only driving scenes of a first type or of a first kind (e.g., same driving conditions), the trained weights of the driver simulation model may only be capable of simulating driver behavior associated with that type of traffic condition. In contrast, in cases where the driving simulation model contains driving scenes of more than one type of traffic conditions/driving scenes, the trained weights of the driver simulation model may simulate driver behavior associated with varying observed and unobserved traffic conditions (e.g., weights that are more generalized to simulate driver behavior for varying driving conditions).

Figure 4:
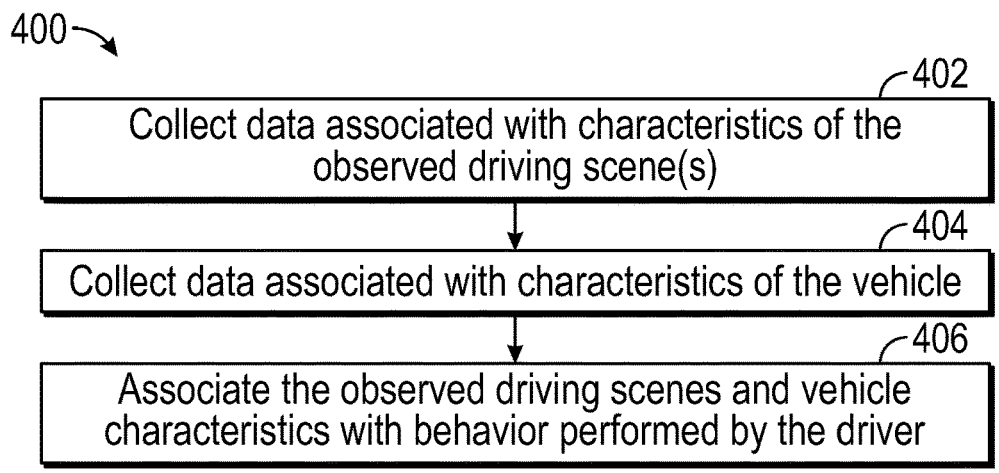
FIG. 4 illustrates an example process for constructing a training set according to examples of the disclosure.

FIG. 4 illustrates an example process 400 for constructing a training set (e.g., a training set similar to training set 306) accordingly to examples of the disclosure. Data of a training set may include independent and/or dependent variables. In some embodiments, the independent variables may include the context of a driving scene at a respective period of time, and/or which ADAS functions were active at that time period, as will be discussed below. In some embodiments, the dependent variables may include: characteristics associated with vehicle speed, acceleration, and/or braking during the respective period of time, characteristics associated with take-over status of the one or more ADAS functions during the respective period of time (e.g., if the driver took over control of respective ADAS function(s) during the respective period of time), and/or characteristics associated with the gaze, confidence, fatigue, and/or awareness, of the driver during the respective period of time. In some embodiments, the data of a training set may be related to driver interactions with vehicles in urban environments and/or driver interactions of a single SAE autonomy level, for example SAE level autonomy level 0-5. Data sets that are of a single autonomy level may allow for the simulated driver behavior to also be of the same autonomy level.

Constructing the exemplary training data set may include block 402. Block 402 may include adding to the training data set one or more driving scene characteristics that correspond to time periods when a driver was interacting with a vehicle (e.g., real vehicle or virtual vehicle). In some embodiments, the driving scene characteristics may be collected from vehicle logs (e.g., logs of camera system 118 and/or other system logs of vehicle 218). The logs of vehicle 218 may provide information associated with the driving scene characteristics of interest, which may include information about traffic conditions, intersection conditions, road conditions, among other driving conditions.

In some embodiments, it may be determined by camera system 118 or other systems of vehicle 218 that the traffic density is of high density if the presence of pedestrians and/or the presence of vehicles are greater than a specified threshold. For example, a traffic intersection for a respective time period may be considered of high density if the traffic intersection contains at least eight other vehicles, at least two oncoming vehicles, and no pedestrians. In contrast, for example, a traffic intersection for a respective time period may be considered of low density if there are no oncoming vehicles and at most two pedestrians are at an intersection. Other possible combinations for determining whether a driving scene is of high density or low density may also be considered.

After adding the driving scene characteristics experienced by a driver of a vehicle 218 for a plurality of time periods, vehicle characteristics associated with the driving scene may also be added to the training set at block 404, such as which ADAS functions of the vehicle were active during the observed driving scene at block 402. In some embodiments, ADAS functions may be activated based on the respective driving scene(s) observed in block 402. For example, if a respective driving scene observed pedestrians in an intersection, some ADAS functions may be automatically activated when pedestrians are present. Similarly, if the respective driving scene did not detect pedestrians, then these ADAS pedestrian specific functions may not be activated during the respective driving scene.

After adding driving scenes and vehicle characteristics to the training set, the driving scenes and vehicle characteristics may be associated with dependent variables at block 406. Block 406 may include for each driving scene and vehicle characteristics added to the training set, associating these characteristic with the respective behaviors performed by the driver. In some embodiments, driving behaviors related to the driver's use of automation during the driving scene (e.g., take-over status), and/or where the driver was looking during the driving scene (among additional or alternative driver behaviors) may be associated with the driving scene and vehicle characteristics. Other driving behaviors may also be associated with the independent variables of the data set, such as characteristics associated with vehicle speed, acceleration, braking, among other characteristics.

Thus, entries in the data set may represent: the driving scene context experienced by the driver (e.g., traffic density, intersection complexity, etc.), automation status of the ADAS functions for the respective driving scene (e.g., ADAS functions on/off), vehicle motion characteristics (e.g., vehicle speed, acceleration, and braking), and driver behavior for the respective driving scene (e.g., gaze and/or take-over status). After blocks 402, 404, and 406 have been performed, the training data set may be used for training a driver simulation model, as discussed in FIG. 3.

Figure 5:
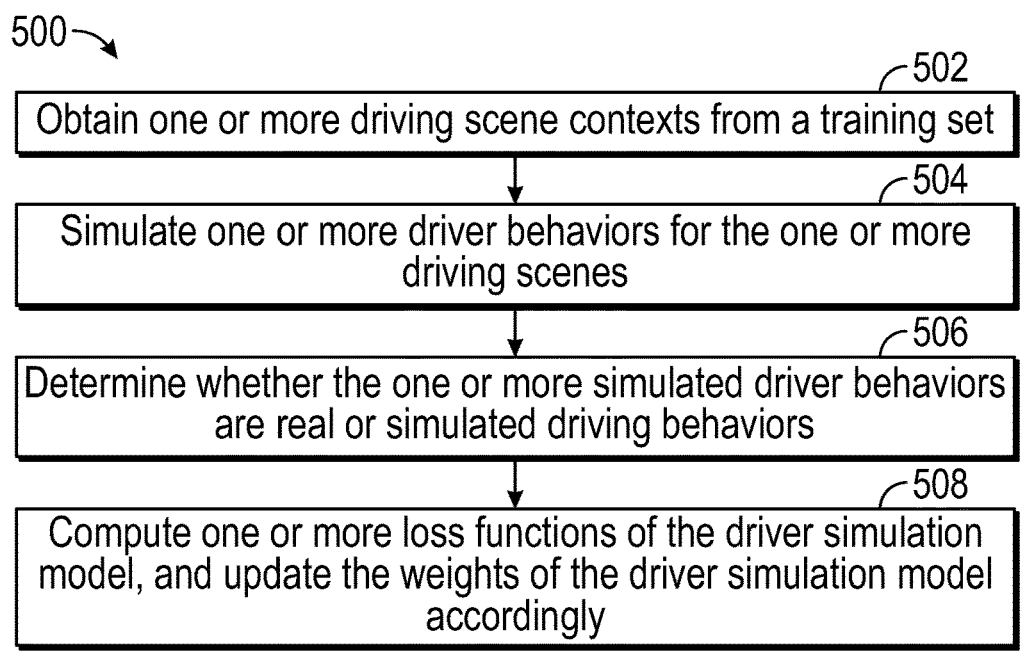
FIG. 5 illustrates an example process for training a driver simulation model according to examples of the disclosure.

FIG. 5 illustrates an example process 500 for training a driver simulation model according to example of the disclosure. Blocks of FIG. 5 may include one or more of the features described with reference to the above figures, some of which will not be repeated here for brevity.

In FIG. 5, process 500 includes, at block 502 obtaining one or more driving scene contexts from a training set (e.g., a training set similar to training set 302). As discussed above, in some embodiments, the driver simulation model may take as input one or more driving scenes (e.g., driving scenes similar to driving scenes 302) from a training data set. The driving scene may include context for the driving scene, such as traffic density, intersection complexity, and/or the reliance on one or more ADAS during the respective driving scene.

Process 500 may also include, at block 504, simulating one or more driver behaviors for the one or more driving scenes. The one or more driving scenes obtained at block 502 may be provided with noise to (e.g., a generator of) the driver simulation model (e.g., a generator similar to generator 304 and a driver simulation model similar to driver simulation model 112 and 212), in which the driver simulation model may produce simulated behaviors of a driver for the one or more driving scenes (e.g., driving scenes with noise). In some embodiments, the generator may simulate a driver's awareness, confidence, fatigue, gaze, and/or the likelihood of the driver taking over one or more active ADAS functions in the driving scene. In some embodiments, vehicle conditions and/or characteristics associated with the driving scene may also be simulated, such as vehicle speed, velocity, acceleration, and braking, among others.

Process 500 may also include, at block 506, determining (e.g., via a discriminator similar to discriminator 310) whether the one or more simulated driver behaviors are real or simulated driving behaviors. Process 500 may also include, at block 508, computing one or more loss functions (e.g., discriminator loss 318, generator loss 316, and/or re-constructor loss 322) of the driver simulation model, and updating the weights of the driver simulation model accordingly.

The computed loss functions of the driver simulation model (e.g., discriminator loss 318, generator loss 316, and/or re-constructor loss 322) at block 508 may be computed based on the determination of whether the simulated driving behavior for the respective driving scene(s) was predicted to be real or simulated driving behavior (discriminator loss), whether the simulated driving behavior produced by the generator caused the discriminator to incorrectly predict that the driving behavior was real or simulated (generator loss), and/or whether the simulated driving behavior is dependent upon the driving scene provided as input to the generator (re-constructor loss). In response to the loss functions computed at block 508, the weights of the driver simulation model may be updated accordingly to ensure the simulated driver behavior approaches more plausible behavior in subsequent training steps (repeating one or more of the above steps).

Figure 6:
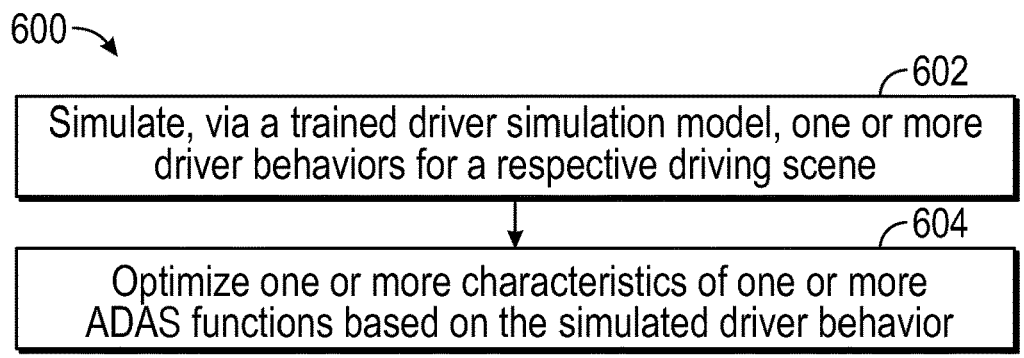
FIG. 6 illustrates an example process for optimizing and/or improving an ADAS function in an offline environment according to examples of the disclosure.
Figure 7:
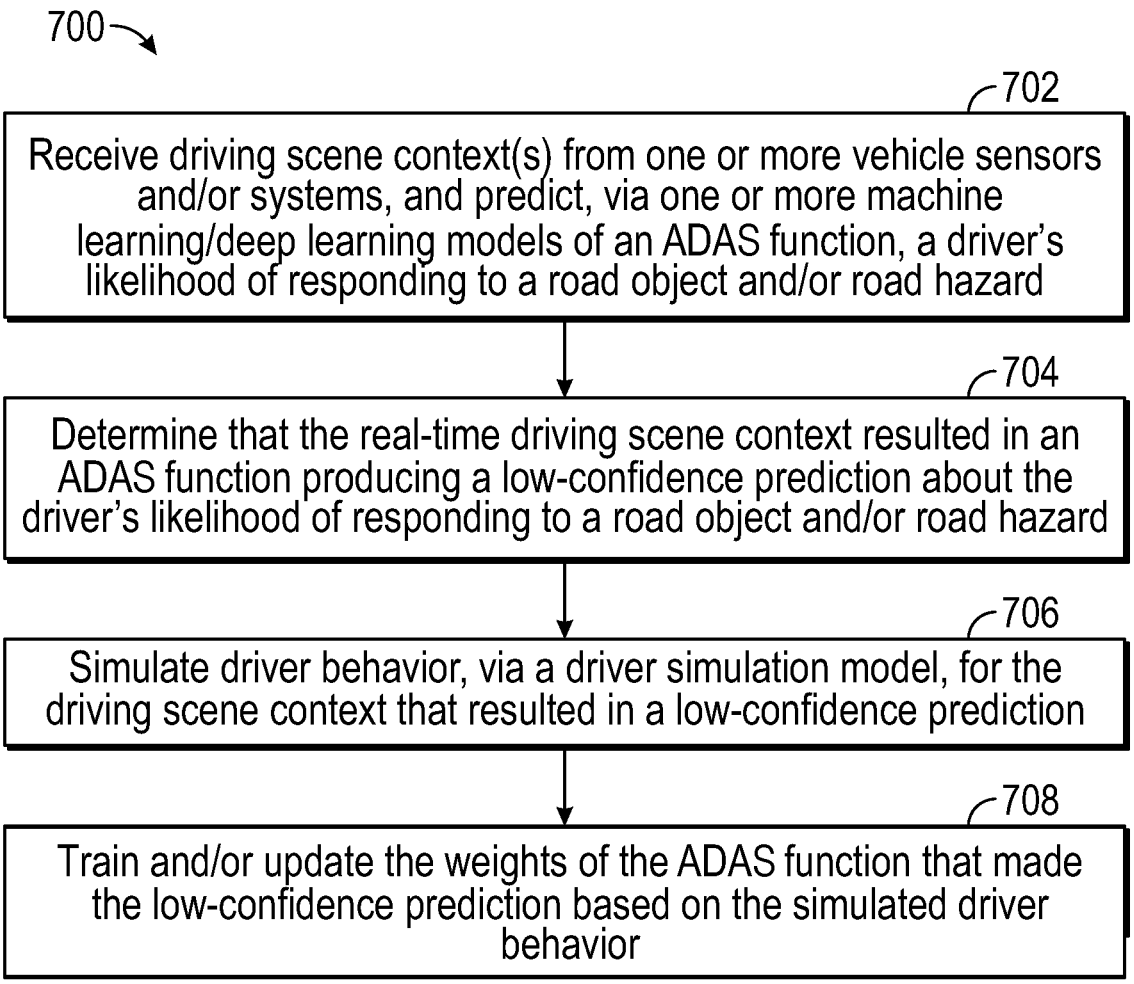
FIG. 7 illustrates an example process for operating, optimizing and/or improving an ADAS function in an online environment according to examples of the disclosure.

After training a driver simulation model, in accordance with process 500, one or more ADAS functions may be optimized. FIGS. 6 and 7 illustrate exemplary processes for optimizing and/or operating advanced driving assistance functions based on a trained driver simulation model. In FIG. 6, process 600 illustrates an example process for optimizing one or more ADAS functions in an offline system. Blocks of FIG. 6 may include one or more of the features described with reference to the above figures, some of which will not be repeated here for brevity.

In FIG. 6, process 600 includes, at block 602, simulating, via a trained driver simulation model (e.g., a driver simulation model 112 or 212), one or more driver behaviors for a respective driving scene. As mentioned above, a trained driver simulation model may take as input a driving scene context, and produce as output corresponding simulated driving behavior for the provided driving scene. Process 600 may also include, at block 604, optimizing one or more characteristics of one or more ADAS functions based on the simulated driver behavior at block 602. In some embodiments, the trained weights of the layers of the driver simulation model that transforms the driving scene context into the simulated driver behavior may be used for optimizing one or more ADAS functions. Additionally, in some embodiments, ADAS functions may optimize their respective functionality by learning (e.g., training on) additional driving scenes that they may not have previously been trained on (e.g., additional driving scenes generated by the driver simulation model).

In FIG. 7, process 700 illustrates an example process for operating and/or optimizing an advanced driving assistance function in an online system. Blocks of FIG. 7 may include one or more of the features described with reference to the above figures, some of which will not be repeated here for brevity.

In FIG. 7, process 700 may include, at block 702, receiving a real-time driving scene context from one or more vehicle sensors and systems (e.g., vehicle sensors and systems similar to eye tracking sensors 206, camera system 208, etc.), and predicting, via one or more machine leaning/deep learning models of an ADAS function (e.g., machine learning models of ADAS functions 214), a driver's likelihood of responding to a road object and/or road hazard. In some embodiments, a camera system of a vehicle may observe a driving scene context in real-time or near real-time, and provide the observed driving scene (e.g., images of a driving scene) to the one or more ADAS functions (e.g., ADAS functions similar to ADAS functions 214)/machine learning models of the ADAS functions. Based on the driving scene provided to the one or more respective ADAS functions, the one or more ADAS functions may predict the driver's awareness and/or likelihood of responding to a respective road object and/or road hazard (e.g., pedestrian, on-coming vehicle, etc.), and may cause a vehicle autonomous controller (e.g., a vehicle autonomous controller similar to vehicle autonomous controller 204) to execute or stop executing autonomous driving commands of a vehicle.

In FIG. 7, process 700 may also include, at block 704, determining that the real-time driving scene context resulted in a low-confidence prediction about the driver's likelihood of responding to a road object and/or road hazard. In some embodiments, a respective ADAS function may perform a prediction about a driver's behavior, but it may be determined that the ADAS function made the prediction with low confidence. When a model makes a low-confidence prediction, this may be attributed to the ADAS function or the machine learning models of the ADAS function being unfamiliar with the observed driving scene. In some embodiments, if an ADAS function did not produce a low confidence prediction the operations at blocks 706 and 708 may not be performed. In some embodiments, if a low confidence prediction was produced by an ADAS function the operations of blocks 706 and 708 may be performed.

In FIG. 7, process 700 may also include, at block 706, simulating driver behavior, via a driver simulation model (e.g., a driver simulation model similar to driver simulation model 212), for the driving scene context that resulted in a low-confidence prediction about the driver's behavior. When it is determined that the ADAS function made a low confidence prediction due to at least the ADAS model being unfamiliar with the observed driving scene, a driver simulation model (e.g., a driver simulation model similar to driver simulation model 212) may take the driving scene as input and produce as output simulated driving behavior for that driving scene.

At block 708, training and/or updating the weights of the one or more ADAS functions that made the low confidence prediction based on the simulated driver behavior produced by the driver simulation model. In some embodiments, the simulated driver behavior produced by the driver simulation model may cause the weights of the machine learning models of the ADAS functions to be updated, as discussed previously. Additionally, in some embodiments, the machine learning models of the ADAS may be re-trained on the additional simulated driving behavior produced by the driver simulation model, as discussed previously.

Therefore, according to the above, some examples of the disclosure are directed to a method comprising: at an electronic device with one or more processors and memory: obtaining one or more characteristics of one or more driving scenes; simulating, via a machine learning model, one or more behaviors of a simulated driver based at least one the one or more characteristics; and performing an operation associated with one or more advanced driving assistance system (ADAS) functions based at least on the simulated one or more behaviors. Additionally or alternatively to one or more of the examples above, in some examples, performing an operation associated with the one or more ADAS functions based at least on the simulated one or more behaviors comprises: improving the one or more ADAS functions based at least on the simulated one or more behaviors and the one or more characteristics of the one or more driving scenes. Additionally or alternatively to one or more of the examples above, in some examples, improving the one or more ADAS functions includes training one or more models associated with the one or more ADAS functions based on the simulated one or more behaviors and the one or more characteristics of the one or more driving scenes. Additionally or alternatively to one or more of the examples above, in some examples, the method further comprises updating one or more parameters of one or more models associated with the one or more ADAS functions based at least on one or more parameters, other than the one or more behaviors, of the machine learning model associated with the simulated driver. Additionally or alternatively to one or more of the examples above, in some examples, obtaining the one or more characteristics of the one or more driving scenes includes detecting the one or more characteristics via one or more sensors of a vehicle while the vehicle is in operation, and performing the operation associated with the one or more ADAS functions comprises adjusting operation of the one or more ADAS functions of the vehicle based on the simulated one or more behaviors. Additionally or alternatively to one or more of the examples above, in some examples, the method further comprises: determining one or more characteristics of one or more future driving scenes associated with the vehicle; and simulating, via the machine learning model, one or more future behaviors of the simulated driver using the one or more characteristics of the one or more future driving scenes, wherein adjusting the operation of the one or more ADAS functions is based on the simulated one or more future behaviors. Additionally or alternatively to one or more of the examples above, in some examples, the one or more driving scenes are synthetic driving scenes generated from one or more observed driving scenes. Additionally or alternatively to one or more of the examples above, in some examples, the one or more driving scenes are synthetic driving scenes generated from one or more observed driving scenes. Additionally or alternatively to one or more of the examples above, in some examples, the machine learning model associated with the simulated driver comprises a generative adversarial network (GAN) model. Additionally or alternatively to one or more of the examples above, in some examples, the GAN model includes a re-constructor model configured to enforce a relationship between inputs and outputs of the GAN model.

Some examples of the disclosure are directed to a non-transitory computer-readable storage medium storing instructions, which when executed by one or more processors of an electronic device, cause the electronic device to perform a method comprising: obtaining one or more characteristics of one or more driving scenes; simulating, via a machine learning model, one or more behaviors of a simulated driver based at least on the one or more characteristics; and performing an operation associated with one or more advanced driving assistance system (ADAS) functions based at least on the simulated one or more behaviors. Additionally or alternatively to one or more of the examples above, in some examples, performing an operation associated with the one or more ADAS functions based at least on the simulated one or more behaviors comprises: improving the one or more ADAS functions based at least on the simulated one or more behaviors and the one or more characteristics of the one or more driving scenes. Additionally or alternatively to one or more of the examples above, in some examples, improving the one or more ADAS functions includes training one or more models associated with the one or more ADAS functions based on the simulated one or more behaviors and the one or more characteristics of the one or more driving scenes. Additionally or alternatively to one or more of the examples above, in some examples, the method further comprises: updating one or more parameters of one or more models associated with the one or more ADAS functions based at least on one or more parameters, other than the one or more behaviors, of the machine learning model associated with the simulated driver. Additionally or alternatively to one or more of the examples above, in some examples, obtaining the one or more characteristics of the one or more driving scenes includes detecting the one or more characteristics via one or more sensors of a vehicle while the vehicle is in operation, and performing the operation associated with the one or more ADAS functions comprises adjusting operation of the one or more ADAS functions of the vehicle based on the simulated one or more behaviors. Additionally or alternatively to one or more of the examples above, in some examples, the method further comprises: determining one or more characteristics of one or more future driving scenes associated with the vehicle; and simulating, via the machine learning model, one or more future behaviors of the simulated driver using the one or more characteristics of the one or more future driving scenes, wherein adjusting the operation of the one or more ADAS functions is based on the simulated one or more future behaviors. Additionally or alternatively to one or more of the examples above, in some examples, the one or more driving scenes are synthetic driving scenes generated from one or more observed driving scenes. Additionally or alternatively to one or more of the examples above, in some examples, the machine learning model associated with the simulated driver comprises a generative adversarial network (GAN) model. Additionally or alternatively to one or more of the examples above, in some examples, the GAN model includes a re-constructor model configured to enforce a relationship between inputs and outputs of the GAN model.

Some examples of the disclosure are directed to an electronic device comprising: one or more processors; and memory storing instructions, which when executed by the one or more processors, cause the electronic device to perform a method comprising: obtaining one or more characteristics of one or more driving scenes; simulating, via a machine learning model, one or more behaviors of a simulated driver based at least on the one or more characteristics; and performing an operation associated with one or more advanced driving assistance system (ADAS) functions based at least on the simulated one or more behaviors. Additionally or alternatively to one or more of the examples above, in some examples, performing an operation associated with the one or more ADAS functions based at least on the simulated one or more behaviors comprises: improving the one or more ADAS functions based at least on the simulated one or more behaviors and the one or more characteristics of the one or more driving scenes.

Although examples have been fully described with reference to the accompanying drawings, it is to be noted that various changes and modifications will become apparent to those skilled in the art. Such changes and modifications are to be understood as being included within the scope of examples of this disclosure as defined by the appended claims.

What is claimed is:

1. A method comprising:
at an electronic device with one or more processors and memory:
obtaining one or more characteristics including driver awareness characteristics of one or more driving scenes, the driver awareness characteristics indicating an awareness level of a driver towards a feature associated with driver intervention, the awareness level being based on an estimated gaze location of the driver;
simulating, via a machine learning model, one or more behaviors of a simulated driver including the driver awareness characteristics, based at least on the one or more characteristics; and
simulating, via a machine learning model, one or more behaviors of a simulated vehicle, based at least on the one or more characteristics; and
performing an operation associated with one or more advanced driving assistance system (ADAS) functions based at least on simulated one or more behaviors comprising the one or more behaviors of the simulated driver and the one or more behaviors of the simulated vehicle.

2. The method of claim 1, wherein performing an operation associated with the one or more ADAS functions based at least on the simulated one or more behaviors comprises:
improving the one or more ADAS functions based at least on the simulated one or more behaviors and the one or more characteristics of the one or more driving scenes.

3. The method of claim 2, wherein improving the one or more ADAS functions includes training one or more models associated with the one or more ADAS functions based on the simulated one or more behaviors and the one or more characteristics of the one or more driving scenes.

4. The method of claim 1, further comprising:
updating one or more parameters of one or more models associated with the one or more ADAS functions based at least on one or more parameters, other than the one or more behaviors, of the machine learning model associated with the simulated driver.

5. The method of claim 1, wherein:
obtaining the one or more characteristics of the one or more driving scenes includes detecting the one or more characteristics via one or more sensors of a vehicle while the vehicle is in operation, and
performing the operation associated with the one or more ADAS functions comprises adjusting operation of the one or more ADAS functions of the vehicle based on the simulated one or more behaviors.

6. The method of claim 5, further comprising:
determining one or more characteristics of one or more future driving scenes associated with the vehicle; and
simulating, via the machine learning model, one or more future behaviors of the simulated driver using the one or more characteristics of the one or more future driving scenes,
wherein adjusting the operation of the one or more ADAS functions is based on the simulated one or more future behaviors.

7. The method of claim 1, wherein the one or more driving scenes are synthetic driving scenes generated from one or more observed driving scenes.

8. The method of claim 1, wherein the machine learning model associated with the simulated driver comprises a generative adversarial network (GAN) model.

9. The method of claim 8, wherein the GAN model includes a re-constructor model configured to enforce a relationship between inputs and outputs of the GAN model.

10. The method of claim 1, wherein the one or more behaviors of the simulated driver that are simulated via the machine learning model include a score corresponding to the driver awareness characteristics of the simulated driver.

11. The method of claim 1, wherein the feature associated with driver intervention is a road object or hazard.

12. The method of claim 1, wherein the feature associated with driver intervention is an active function of one or more advanced driving assistance system (ADAS) functions.

13. The method of claim 1, wherein the one or more behaviors of the simulated driver that are simulated via the machine learning model include a likelihood of the simulated driver responding to the feature associated with driver intervention.

14. A non-transitory computer-readable storage medium storing instructions, which when executed by one or more processors of an electronic device, cause the electronic device to perform a method comprising:

obtaining one or more characteristics including driver awareness characteristics of one or more driving scenes, the driver awareness characteristics indicating an awareness level of a driver towards a feature associated with driver intervention, the awareness level being based on an estimated gaze location of the driver;

simulating, via a machine learning model, one or more behaviors of a simulated driver including the driver awareness characteristics, based at least on the one or more characteristics; and simulating, via a machine learning model, one or more behaviors of a simulated vehicle, based at least on the one or more characteristics; and performing an operation associated with one or more advanced driving assistance system (ADAS) functions based at least on simulated one or more behaviors comprising the one or more behaviors of the simulated driver and the one or more behaviors of the simulated vehicle.

15. The non-transitory computer-readable storage medium of claim 14, wherein performing the operation associated with the one or more ADAS functions based at least on the simulated one or more behaviors comprises:

improving the one or more ADAS functions based at least on the simulated one or more behaviors and the one or more characteristics of the one or more driving scenes.

16. The non-transitory computer-readable storage medium of claim 15, wherein improving the one or more ADAS functions includes training one or more models associated with the one or more ADAS functions based on the simulated one or more behaviors and the one or more characteristics of the one or more driving scenes.

17. The non-transitory computer-readable storage medium of claim 14, the method further comprising:

updating one or more parameters of one or more models associated with the one or more ADAS functions based at least on one or more parameters, other than the one or more behaviors, of the machine learning model associated with the simulated driver.

18. The non-transitory computer-readable storage medium of claim 14, wherein:

obtaining the one or more characteristics of the one or more driving scenes includes detecting the one or more characteristics via one or more sensors of a vehicle while the vehicle is in operation, and performing the operation associated with the one or more ADAS functions comprises adjusting operation of the one or more ADAS functions of the vehicle based on the simulated one or more behaviors.

19. The non-transitory computer-readable storage medium of claim 18, the method further comprising:

determining one or more characteristics of one or more future driving scenes associated with the vehicle; and simulating, via the machine learning model, one or more future behaviors of the simulated driver using the one or more characteristics of the one or more future driving scenes, wherein adjusting the operation of the one or more ADAS functions is based on the simulated one or more future behaviors.

20. The non-transitory computer-readable storage medium of claim 14, wherein the one or more driving scenes are synthetic driving scenes generated from one or more observed driving scenes.

21. The non-transitory computer-readable storage medium of claim 14, wherein the machine learning model associated with the simulated driver comprises a generative adversarial network (GAN) model.

22. The non-transitory computer-readable storage medium of claim 21, wherein the GAN model includes a re-constructor model configured to enforce a relationship between inputs and outputs of the GAN model.

23. An electronic device comprising:

one or more processors; and memory storing instructions, which when executed by the one or more processors, cause the electronic device to perform a method comprising:

obtaining one or more characteristics including driver awareness characteristics of one or more driving scenes, the driver awareness characteristics indicating an awareness level of a driver towards a feature associated with driver intervention, the awareness level being based on an estimated gaze location of the driver;

simulating, via a machine learning model, one or more behaviors of a simulated driver including the driver awareness characteristics, based at least on the one or more characteristics; and simulating, via a machine learning model, one or more behaviors of a simulated vehicle, based at least on the one or more characteristics; and performing an operation associated with one or more advanced driving assistance system (ADAS) functions based at least on simulated one or more behaviors comprising the one or more behaviors of the simulated driver and the one or more behaviors of the simulated vehicle.

24. The electronic device of claim 23, wherein performing the operation associated with the one or more ADAS functions based at least on the simulated one or more behaviors comprises:

improving the one or more ADAS functions based at least on the simulated one or more behaviors and the one or more characteristics of the one or more driving scenes.

* * * * *